(12) United States Patent
Togashi (10) Patent No.: US 9,434,027 B2
(45) Date of Patent: Sep. 6, 2016

(54) BONDING WIRE AND METHOD FOR MANUFACTURING SAME (71) Applicant: NIPPON MICROMETAL CORPORATION, Iruma-shi, Saitama (JP)

(72) Inventor: Ryo Togashi, Isa (JP)

(73) Assignee: NIPPON MICROMETAL CORPORATION, Iruma-Shi, Saitama (JP)

( * ) Notice: Subject to any disclaimer, the term of this patent is extended or adjusted under 35 U.S.C. 154(b) by 0 days.

(21) Appl. No.: 14/335,225

(22) Filed: Jul. 18, 2014

(65) Prior Publication Data

US 2014/0329106 A1  Nov. 6, 2014

Related U.S. Application Data (63) Continuation of application No. PCT/JP2013/050625, filed on Jan. 16, 2013.

(30) Foreign Application Priority Data

Jan. 25, 2012 (JP) .................. 2012-012778

(51) Int. Cl.
*B21C 37/04* (2006.01)
*B23K 35/02* (2006.01)
(Continued)

(52) U.S. Cl.
CPC ............ *B23K 35/0227* (2013.01); *B21C 1/02* (2013.01); *B21C 9/00* (2013.01); *B21C 37/042* (2013.01); *B23K 35/22* (2013.01); *B23K 35/302* (2013.01); *B23K 35/404* (2013.01); *B32B 15/018* (2013.01); *C22C 9/00* (2013.01); *C22F 1/00* (2013.01); *C22F 1/08* (2013.01); *H01L 24/43* (2013.01); *H01L 24/45* (2013.01); *H01L 24/745* (2013.01); *B22D 11/041* (2013.01); *H01L 2224/43* (2013.01); *H01L 2224/4321* (2013.01); *H01L 2224/43125* (2013.01); *H01L 2224/43848* (2013.01); *H01L 2224/43986* (2013.01); *H01L 2224/45015* (2013.01); *H01L 2224/45147* (2013.01); *H01L 2224/45565* (2013.01); *H01L 2224/45572* (2013.01);
(Continued)

(58) Field of Classification Search
None
See application file for complete search history.

(56) References Cited

U.S. PATENT DOCUMENTS

2007/0235887 A1 * 10/2007 Kaimori et al. .............. 257/784
2010/0294532 A1    11/2010 Uno et al.

FOREIGN PATENT DOCUMENTS

| JP | 2006-100777 | 4/2006 |
| JP | 4158928 | 10/2008 |

(Continued)

OTHER PUBLICATIONS

Office Action of Japanese patent application JP2013-555221 and its English translation.

(Continued)

*Primary Examiner* — Daniel J Schleis
(74) *Attorney, Agent, or Firm* — Troutman Sanders LLP (57) ABSTRACT

It is an object of the present invention to provide a bonding wire capable of maintaining a structure and a configuration thereof at the time of performing wire bonding; and a manufacturing method thereof. Provided is a bonding wire having a core member mainly composed of copper; and a palladium coating layer. Particularly, formed in a center of the core member is a fibrous structure with copper crystals extending in an axial direction.

8 Claims, 6 Drawing Sheets

(51) Int. Cl.
*C22F 1/00* (2006.01)
*C22F 1/08* (2006.01)
*H01L 23/00* (2006.01)
*B23K 35/30* (2006.01)
*B32B 15/01* (2006.01)
*C22C 9/00* (2006.01)
*B21C 1/02* (2006.01)
*B21C 9/00* (2006.01)
*B23K 35/22* (2006.01)
*B23K 35/40* (2006.01)
*B22D 11/041* (2006.01)

(52) U.S. Cl.
CPC ............... *H01L 2224/45644* (2013.01); *H01L 2224/45664* (2013.01); *H01L 2224/745* (2013.01); *H01L 2924/00014* (2013.01); *H01L 2924/01006* (2013.01); *H01L 2924/01015* (2013.01); *Y10T 29/49988* (2015.01); *Y10T 428/12222* (2015.01)

(56) References Cited

FOREIGN PATENT DOCUMENTS

| | | |
|---|---|---|
| JP | 2009-158931 | 7/2009 |
| JP | 4860004 B1 | 1/2012 |
| TW | 200937546 A | 9/2009 |
| WO | 2012/117636 | 9/2012 |

OTHER PUBLICATIONS

International Search Report dated Mar. 12, 2013, which issued during prosecution of International Application No. PCT/JP2013/050625.

Taiwanese Office Action dated Feb. 18, 2016 issued in corresponding Taiwanese Patent Application No. 102102164.

\* cited by examiner

BONDING WIRE AND METHOD FOR MANUFACTURING SAME

CROSS-REFERENCE TO RELATED APPLICATIONS

The present application is a continuation application of International Application No. PCT/JP2013/050625, filed Jan. 16, 2013, which claims priority to Japanese Patent Application No. 2012-012778, filed Jan. 25, 2012. The contents of these applications are incorporated herein by reference in their entirety.

BACKGROUND OF THE INVENTION

1. Field of the Invention

The present invention relates to a bonding wire and a method for manufacturing the same. Particularly, the present invention relates to a bonding wire having a core member mainly composed of copper; and a palladium coating layer or a coating layer of palladium and gold, and a method for manufacturing the same.

2. Description of Related Art

Conventionally, there has been known a palladium-coated copper bonding wire (e.g. Japanese Patent No. 4158928) obtained by coating a core member mainly composed of copper with palladium.

A palladium-coated copper bonding wire for commercial use is often heated through a plasma arc under a nitrogen gas atmosphere, followed by performing ultrasonic thermocompression bonding to bond a ball that is formed through melting and solidification to an aluminum pad on a semiconductor device. When forming a ball under a nitrogen gas atmosphere, efforts have been made to maintain a sphericity of a melted ball before solidifying by adding to a copper core member phosphorus as a deoxidizing agent such that a surface tension of a ball surface can be maintained as a result of preventing oxidation of copper if exposed when forming the ball.

Due to the continuous efforts that have been made, there are now various types of packaging using a palladium-coated copper wire in recent days. In fact, palladium-coated copper wires are used more often than before even to perform packaging requiring a high reliability.

SUMMARY OF THE INVENTION

However, since only one side of a substrate is to be encapsulated by resin when performing QFN (Quad Flat No-lead) or BGA (Plastic Ball Grid Array) packaging using a palladium-coated copper bonding wire, a weak moisture resistance is exhibited. For this reason, a life of a palladium-coated copper bonding wire has been observed to be shorter than that of a bare copper wire in a reliability test such as a pressure cooker test (referred to as PCT hereunder) or highly accelerated temperature and humidity stress test (referred to as HAST hereunder) where a high humidity and pressure is employed such that moisture can easily enter the package. According to the studies conducted by the inventors and others, it is now clear that when copper is exposed at a ball-bonded portion, a significant corrosion occurs in a ball-bonded interface of the aluminum pad such that a conduction failure occurs due to an oxidation of aluminum. As for a bare copper wire, it has been known that since a surface oxidation of a ball can be avoided when the ball is formed under a nitrogen gas atmosphere containing hydrogen at a ratio of 4 to 5 Vol % rather than a nitrogen atmosphere, a high reliability is achieved in the PCT or HAST reliability test where susceptibility to moisture and oxygen is significant. However, as for a palladium-coated copper wire, it has been found that a low reliability is exhibited under the aforementioned condition.

According to some further studies conducted by the inventors and others, it is now clear that when forming a ball with a palladium-coated copper wire through arc plasma discharge in the nitrogen containing hydrogen at the ratio of 4 to 5 Vol %, observed are abnormalities in appearance such as an exposure of copper on the ball surface; a small-ball defect due to a failure in successfully melting a wire front end and then achieving a ball diameter of a given size; and a peach-like dent formed on the ball surface.

It has been assumed that when heating the wire front end with a plasma arc under the mixed gas atmosphere of nitrogen containing hydrogen at the ratio of 4 to 5 Vol %, a plasma temperature tends to be higher than that when heated under a 100% nitrogen gas atmosphere containing no hydrogen, thereby causing a melting point of palladium to decrease when alloyed with copper, thus leading to appearance defects of the ball as, for example, the palladium film melts into the copper ball; copper is exposed on the ball surface due to the palladium film partially melted; or an uneven portion is formed on the ball surface, whereby an bondability deteriorates and a HAST reliability decreases due to a galvanic corrosion of copper.

Further, it has been assumed that the reason for the palladium film to melt into the ball is partially because a melting time is long and the palladium film thereby melts significantly. It is also assumed that the palladium film can be prevented from melting by rapidly cooling the ball that has been formed and thereby maintaining the original structure of a bonding wire.

Here, it is an object of the present invention to provide a bonding wire capable of restricting a palladium film from melting at the time of forming a ball; increasing a sphericity of the shape of a ball formed with a palladium-coated copper bonding wire; restricting copper from being exposed on a surface of a ball formed through discharge under nitrogen containing hydrogen at a ratio of 4 to 5 Vol %; and exhibiting a favorable HAST reliability when subjected to a humidity, and a method for manufacturing the same.

In order to achieve the aforementioned objective, a bonding wire of a mode of the present invention includes: a core member mainly composed of copper; and a palladium coating layer or a coating layer of palladium and gold, in which the core member has a fibrous structure with copper crystals extending in an axial direction, the fibrous structure being formed in a center of the core member.

A method for manufacturing the aforementioned bonding wire of the present invention, includes: a core-member preparation step of preparing the core member through continuous casting; a first drawing step of performing drawing with a die of a rate of reduction in area of not higher than 10% until a rate of reduction in area of the core member has reached a given rate of reduction in area, and then performing drawing with a die of a rate of reduction in area of larger than 10% after the core member has reached the given rate of reduction in area; a plating step of forming a coated copper wire by plating a circumference of the core member drawn in the first drawing step; and a second drawing step of performing drawing on the coated copper wire until a wire diameter thereof has reached a given diameter.

Further, it is preferable to provide, between the first drawing step and the palladium plating step, a softening heat treatment step of performing a softening heat treatment on the core member drawn in the first drawing step at a temperature not lower than a recrystallization starting temperature and not higher than a recrystallization ending temperature.

Here, it is preferred that the given rate of reduction in area be 95.0 to 99.5%.

Particularly, the first drawing step is performed by repeatedly performing drawing using one die placed between a supplying capstan for supplying the core member and a winding capstan for winding the core member.

The present invention makes it possible to appropriately maintain a structure and configuration of a bonding wire at the time of performing wire bonding.

DETAILED DESCRIPTION OF THE INVENTION

An example for carrying out the invention is described hereunder with reference to the accompanying drawings.

Figure 1:
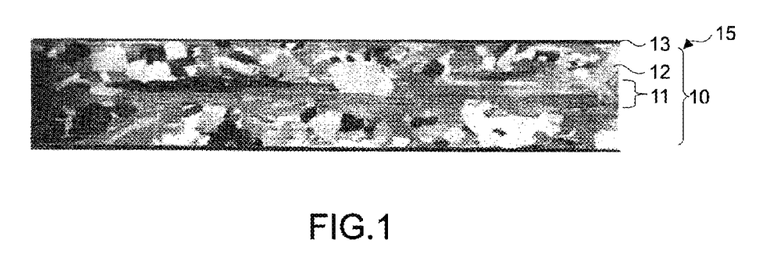
FIG. 1 is a cross-sectional structural diagram showing an example of a bonding wire of a mode of the present invention.

FIG. 1 is a cross-sectional structural diagram showing an example of a bonding wire of the present invention. As shown in FIG. 1, a bonding wire 15 of the present mode includes a core member 10 and a palladium film 13. The core member 10 is mainly composed of copper; and includes a fibrous structure 11 and a recrystallized region 12 in terms of structural configuration. The palladium film 13 is a metal film with which the core member 10 is coated. That is, the bonding wire 15 of the present mode is a palladium-coated copper bonding wire having a structure in which the core member 10 mainly composed of copper is circumferentially coated with the palladium film 13.

A method for manufacturing the bonding wire 15 of the present mode is described later in detail. The bonding wire 15 of the present mode is obtained as follows. That is, an additive element(s) are to be melted into a copper of a purity of not lower than 99.99% in order to cast a copper ingot, followed by drawing the copper ingot thus obtained into a wire by means of dies while allowing the fibrous structure 11 to remain therein. Particularly, a softening heat treatment, if necessary, is performed after performing drawing, such that the wire may have a given wire diameter. Next, copper structure is to be exposed on the surface of the wire by performing various types of chemical cleaning, followed by plating the wire with palladium, and then gold if necessary. Later, drawing is again performed to shrink the diameter of the wire to a given wire diameter, and the softening heat treatment is likewise performed again thereafter. At that time, by adjusting a softening temperature, there can be obtained the palladium-coated copper bonding wire with the fibrous structure 11 formed in a center of the core member.

Here, the fibrous structure 11 refers to a metal structure that remains in the form of fibers; and exhibits no significant recrystallization and grain coarsening even when heated after crystals have been drawn in a drawing direction at the time of casting. As easily observed in a cross-section shown in FIG. 1, while the grain-shaped recrystallized region 12 is formed through recrystallizations of crystals in the vicinity of the wire surface, formed in a central area is the fibrous structure 11 extending in a wire longitudinal direction. Since a hardness of the fibrous structure 11 is observed, through a hardness measurement, to be higher than that of recrystallized crystal grains, the existence of the fibrous structure 11 can also be confirmed through a hardness measurement.

It is preferred that the fibrous structure exists in the core member in an amount of 0.5 to 90% by mass; more preferably in an amount of 1 to 80% by mass; and even more preferably in an amount of 4 to 50% by mass.

Further, it is preferred that the fibrous structure exists within a region of 0.8R from a center; more preferably within a region of 0.5R from the center, provided that a radius of the core member is R.

As for this bonding wire 15 with the fibrous structure 11 remaining in a central thereof, it is considered that the palladium film 13 can be restricted from melting, since a ball formed at the time of performing wire bonding is cooled rapidly as the fibrous structure 11 serves to absorb a heat energy. That is, since the fibrous structure 11 is a coarse structure that is not yet recrystallized, a recrystallization of this fibrous structure takes place when subjected to a heat energy, thus allowing the heat energy to be consumed. Therefore, it is considered that the palladium film can be restricted from melting into an inner region of the ball, since a decrease in a melting temperature or shortening of a solidification time is facilitated as the ball being formed melts or solidifies.

In this way, as for the bonding wire 15 of the present mode, it is considered that wire bonding can be performed in a favorable manner due to the fact that a heat of the ball that occurs at the time of performing wire bonding can be rapidly absorbed by the fibrous structure 11 remaining inside the core member 10.

Figure 2:
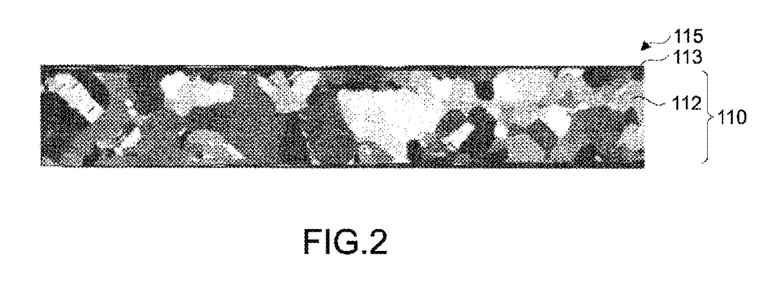
FIG. 2 is a diagram showing a cross-sectional structure of a bonding wire of a comparative example.

FIG. 2 shows a cross-sectional structure of a bonding wire of a comparative example. A bonding wire 115 of the comparative example includes a core member 110 that is entirely composed of a recrystallized region 112 with no fibrous structure 11 remaining therein. As for this structure, when forming the ball, since there exists no region capable of consuming the heat energy generated at the time of melting the ball, a palladium film 113 melts into the inner region of the ball, thus resulting in a high possibility that copper of the core member 110 may be exposed.

In contrast, the bonding wire 15 of the present mode allows the fibrous structure 11 to consume the heat energy, thereby preventing the palladium film 13 from melting into the inner region of the ball, thus restricting copper from being exposed. Accordingly, surface oxidation is prevented, thus improving a joining reliability afterwards.

Next, the method for manufacturing the bonding wire of the present mode of the invention is described with reference to FIG. 3A to FIG. 3C; and FIG. 4 to FIG. 9.

Figure 3A:
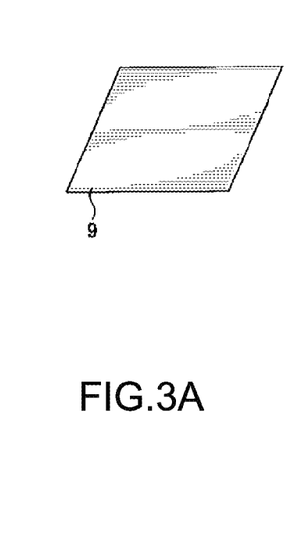
FIG. 3A is a diagram showing an example of a material used in a core-member preparation step of a method for manufacturing the bonding wire of the mode of the present invention.
Figure 3B:
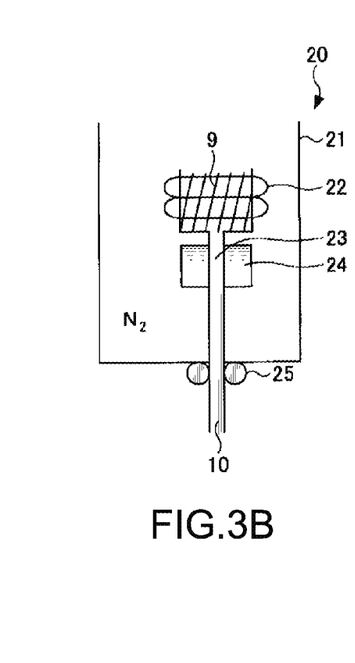
FIG. 3B is a diagram showing an example of continuous casting performed in the core-member preparation step.
Figure 3C:
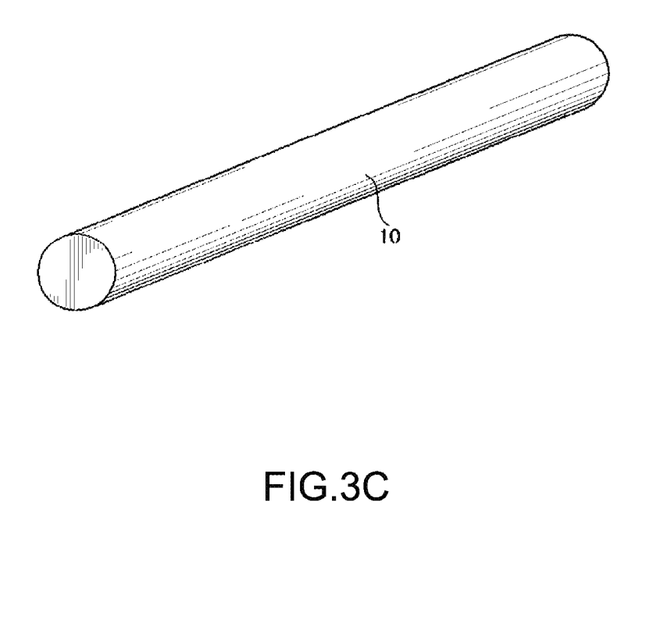
FIG. 3C is a diagram showing an example of a core member prepared in the core-member preparation step.

FIG. 3A to FIG. 3C are diagrams showing an example of a core-member preparation step of the method for manufacturing the bonding wire of the present mode of the invention. Specifically, FIG. 3A is a diagram showing an example of a material used in the core-member preparation step; FIG. 3B is a diagram showing an example of continuous casting; and FIG. 3C is a diagram showing an example of a core member prepared in the core-member preparation step.

As shown in FIG. 3A, in a metal preparation step, copper as the material of the core member 10 is supplied in the form of, for example, a plate-shaped copper plate 9. Here, a metal plate containing an additive(s) is prepared in a similar fashion if the additive(s) are needed.

As shown in FIG. 3B, the core member 10 is prepared using a continuous casting device 20. The continuous casting device 20 includes: a chamber 21; a tundish 22; a casting mold 23; a water jacket 24; and a roller 25. The continuous casting device allows the copper plate 9 to be melted inside the tundish 22 that is stowed in the chamber 21. The copper plate 9 thus melted then passes through the casting mold 23 equipped with the water jacket 24, before being drawn out by the roller 25 to form the core member 10. Specifically, the chamber 21 may be filled with, for example, a nitrogen gas. Further, other than the copper plate 9, an additive(s) may also be supplied to and melted in the tundish 22. Furthermore, if needed, there may also be provided a ladle for supplying the melted copper plate 9 to the tundish 22; and a type of roller 25 that is multifunctional.

FIG. 3C shows an example of the core member 10 prepared through continuous casting. Here, the core member 10 obtained immediately after casting has a wire diameter significantly larger than that of the final bonding wire 15, the wire diameter being as large as several millimeters, for example.

Figure 4:
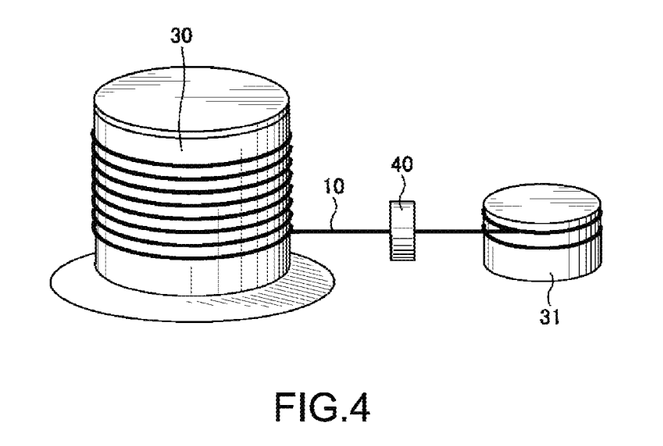
FIG. 4 is a diagram showing an example of a post-casting drawing step in the method for manufacturing the bonding wire of the mode of the present invention.

FIG. 4 is a diagram showing an example of a post-casting drawing step of the method for manufacturing the bonding wire of the present mode of the invention. In this post-casting drawing step, the core member 10 is drawn and subjected to a reduction in area (shrinkage in diameter). As shown in FIG. 4, in the post-casting drawing step, the core member 10 is drawn using a pair of capstans 30, 31; and a die 40. Since the core member 10 has the thickness of several millimeters, and a large force is thus required to insert the same through the die 40, only one die 40 is disposed between the capstans 30 and 31 such that drawing can be performed with a sufficient force. The post-casting drawing step is repeated multiple times until the wire diameter of the core member 10 has reached a given value. For example, in the post-casting drawing step, the core member 10 may be drawn to a wire diameter of about 1 mm.

However, in the post-casting drawing step where the core member 10 obtained immediately after casting is drawn, if employing a high rate of reduction in area from the start to shrink the diameter of the core member, the fibrous structure 11 illustrated in FIG. 1 may not remain; and the metal structure may stretch completely.

Therefore, as for the method for manufacturing the bonding wire of the present mode, drawing is performed at a rate of reduction in area of not higher than 10% until a cumulative rate of reduction in area of the core member 10 has reached a given rate of reduction in area. Specifically, a rate of reduction in area is expressed by a formula (I). More specifically, a rate of reduction in area may be referred to as a diameter shrinkage rate or a reduction rate.

(Formula 1)

$$\text{(Rate of reduction in area)} = \frac{\left(\begin{array}{c}\text{Wire diameter prior}\\ \text{to die insertion}\end{array}\right)^2 - \left(\begin{array}{c}\text{Wire diameter after}\\ \text{die insertion}\end{array}\right)^2}{(\text{Wire diameter prior to die insertion})^2} \times 100(\%) \quad (1)$$

The aforementioned given rate reached by continuing performing drawing at the rate of reduction in area of not higher than 10%, is set to be an appropriate value allowing the fibrous structure 11 to remain in the center of the core member 10. Particularly, it is preferred that such value is set to be 95.0 to 99.5%; more preferably 96%. That is, the value is equal to 96%, when the core member 10 of a diameter of 8 mm obtained immediately after casting has been reduced to that of a diameter of 1.6 mm. For example, the invertors and others have confirmed through experiments that the fibrous structure 11 remains after performing reduction in area on the core member 10 mainly composed of copper from 8 mm to 1.6 mm. Working examples regarding this finding are described later.

Figure 5:
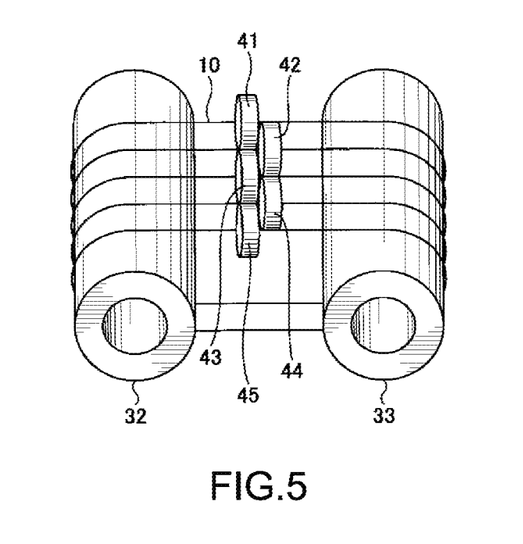
FIG. 5 is a diagram showing an example of a primary drawing step in the method for manufacturing the bonding wire of the mode of the present invention.

FIG. 5 is a diagram showing an example of a primary drawing step of the method for manufacturing the bonding wire of the present mode of the invention. In the primary drawing step, drawing is performed using a pair of capstans 32, 33; and a plurality of dies 41 to 45. Also in the primary drawing step, since the diameter of the core member 10 is now smaller than that observed in the post-casting drawing step, a force used to perform drawing is smaller than that used in the post-casting drawing step, and drawing can then be efficiently performed using the plurality of the dies 41 to 45. The primary drawing step allows the core member 10 to be processed to a size of several hundred micrometers. However, the primary drawing step may be employed on an as-needed basis.

Figure 6:
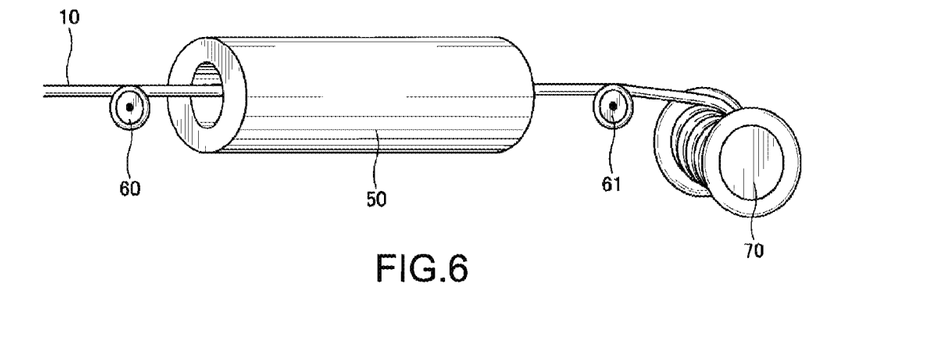
FIG. 6 is a diagram showing an example of a softening heat treatment step in the method for manufacturing the bonding wire of the mode of the present invention.

FIG. 6 is a diagram showing an example of a softening heat treatment step of the method for manufacturing the bonding wire of the present mode of the invention. In the softening heat treatment step, the core member 10 is caused to pass through a cylindrical heater 50, using guiding rollers 60, 61. In this way, the core member 10 is softened when treated with heat. Particularly, a hardness of the core member 10 is to be adjusted to prevent a pad or the like from being damaged at the time of performing wire bonding. Moreover, the core member 10 thus treated with heat and softened is to be wound around a spool 70.

Here, in the method for manufacturing the bonding wire of the present mode, the softening heat treatment step is performed at a temperature not lower than a recrystallization starting temperature and not higher than a recrystallization ending temperature.

Figure 7:
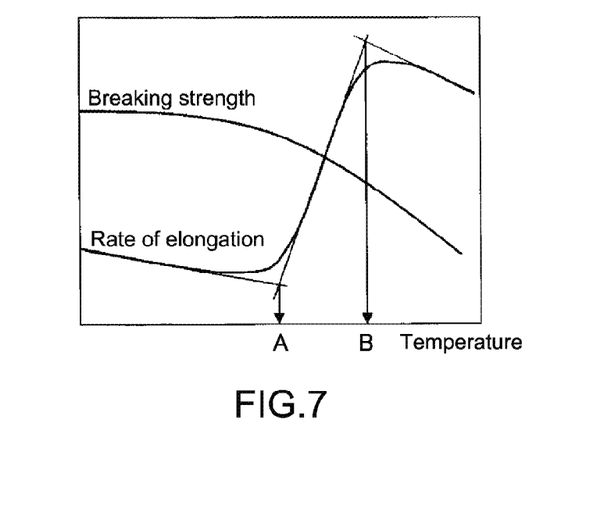
FIG. 7 is a diagram showing changes in a breaking strength and a rate of elongation; and a recrystallization starting temperature and a recrystallization ending temperature, as a drawn metal wire is heated.

FIG. 7 is a diagram showing: changes in a breaking strength and an elongation ratio of the drawn metal wire being heated; and the recrystallization starting and ending temperatures.

In FIG. 7, while a horizontal axis represents the temperatures, a vertical axis represents the breaking strength and elongation ratio of the metal wire. In general, the casted copper core member 10, when drawn, exhibits an increase in breaking strength as a degree of processing increases; and a decrease in elongation ratio, before reaching a saturated state in a gradual manner. Particularly, when heating such core member 10, there exists a temperature at which the elongation ratio starts to increase rapidly. This temperature is referred to as the recrystallization starting temperature (A in FIG. 7). Meanwhile, a temperature at which the elongation ratio reaches its maximum level is referred to as the recrystallization ending temperature (B in FIG. 7). When heated with a temperature not lower than the recrystallization ending temperature, crystals coarsen as a whole in general, thus achieving a sufficiently softened state as a material. In the method for manufacturing the bonding wire of the present mode of the invention, although a recrystallization of the core member 10 occurs when a heating temperature is not lower than the recrystallization starting temperature, recrystallization of the overall diameter does not occur when the heating temperature is not higher than the recrystallization ending temperature. As a result, while the core member 10 is softened, an overall recrystallization does not take place such that a portion thereof remains as the fibrous structure 11.

As shown in FIG. 6, since the heater 50 heats the core member 10 from an outer circumferential surface thereof, while an outer side of the core member 10 is recrystallized to form the recrystallized region 12; the center of the core member 10 that is close to an axis thereof is not recrystallized such that the fibrous structure 11 remains. It is understood that this structure is identical to that shown in FIG. 1.

Therefore, in the method for manufacturing the bonding wire of the present mode, the softening heat treatment step is performed with a temperature not lower than the recrystallization starting temperature and not higher than the recrystallization ending temperature, thereby softening the core member 10 and allowing the fibrous structure 11 to remain in the center of the core member 10.

However, the softening heat treatment step may not necessarily be performed, if the hardness of the core member 10 is acceptable. That is, the softening heat treatment step may be performed on an as-needed basis.

Figure 8:
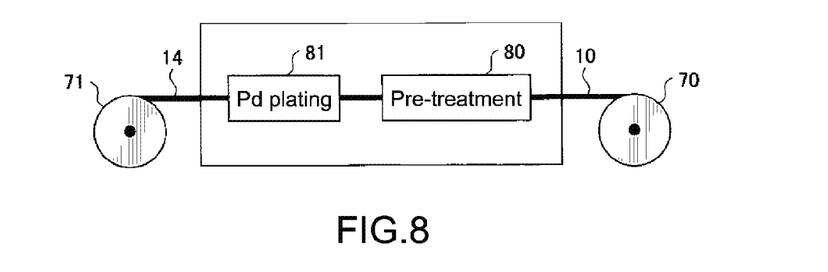
FIG. 8 is a diagram showing an example of a plating step in the method for manufacturing the bonding wire of the mode of the present invention.

FIG. 8 is a diagram showing an example of a plating step of the method for manufacturing the bonding wire of the present mode of the invention. As shown in FIG. 8, in the plating step, the core member 10 wound around the spool 70 is wound thereof and supplied to a pre-plating treatment bath 80 and a plating bath 81, thereby allowing the palladium film 13 to be formed on a circumference of the core member 10 through plating. Next, a palladium-coated copper wire 14 thus prepared through plating is to be wound around a spool 71 provided on an exit side. If necessary, a gold layer may also be formed on the palladium coating layer through plating. A gold plating step may be performed by employing a plating device similar to that shown in FIG. 8 as is the case for performing palladium plating; or successively performed in a continuous manner after performing palladium plating.

A pre-plating treatment step includes multiple treatment steps. In fact, the number of the pre-plating treatment baths 80 employed may not necessarily be one. In FIG. 8, there is shown one pre-plating treatment bath 70 due to space limitation.

The pre-plating treatment step includes: a degreasing step of removing a grease of the core member 10; a hydrochloric acid washing step of removing an oxidized film formed on the surface of the core member 10; a chemical polishing step of polishing the surface of the core member 10 by thinly melting the same; and a sulfuric acid washing step of washing the core member 10 with a sulfuric acid. These pre-treatment steps allow impurities or the like surrounding the core member 10 to be removed; and the surface of the core member 10 to be washed, thus achieving a state where the plating step can be easily performed.

The palladium plating step is a step of forming the palladium film 13 by performing palladium plating on the circumference of the core member 10 mainly composed of copper. As for the plating step, there can be performed various kinds of plating treatments as long as the palladium film 13 can be formed on the circumference of the core member 10. For example, the plating step may include two steps such as a strike plating step and a regular plating step. Electroplating is performed in the strike plating step and the regular plating step. Here, an anode is provided in the plating bath 71, and the core member 10 is electrically conducted to a cathode by, for example, a power feeding roller (not shown). Further, the core member 10 electrically conducted to the cathode is to be dipped into a plating solution containing palladium ions $Pd^{2+}$, thereby allowing the palladium ions $Pd^{2+}$ which are positive ions to be electrodeposited on the core member 10, thus allowing the same to be plated.

In the strike plating step, electric conduction is performed at a high current density in a short period of time e.g. a current density of not lower than 10 $A/dm^2$. Meanwhile, in the regular plating step, the current density employed is lower than that of strike plating e.g. plating is performed at about 3 to 5 $A/dm^2$ in a period of time longer than that of strike plating. That is, by performing the two steps such as the strike plating step and the regular plating step, the copper core member 10 can be plated with palladium such that the palladium film 13 can then be formed on the circumference of the core member 10. Further, the palladium-coated copper wire 14 obtained after performing plating is to be wound around the spool 71.

If necessary, a gold plating step is performed after performing the aforementioned palladium plating. In fact, gold plating may be performed through electroplating as is the case in palladium plating.

Figure 9:
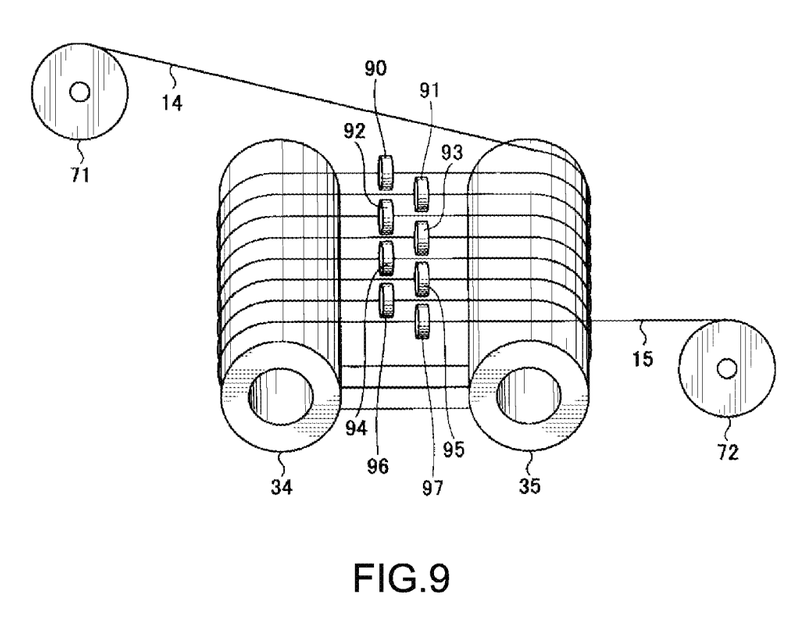
FIG. 9 is a diagram showing an example of a final drawing step in the method for manufacturing the bonding wire of the mode of the present invention.

FIG. 9 is a diagram showing an example of a final drawing step of the method for manufacturing the bonding wire of the present mode. In the final drawing step, either the palladium-coated copper wire or a gold-palladium-coated copper wire 14 is drawn such that the diameter thereof is to be shrunk to a given wire diameter. Particularly, in the final drawing step, drawing is performed until the wire diameter has reached the diameter identical to that of the final product.

As shown in FIG. 9, even in the final drawing step, the coated copper wire 14 wound around the spool 71 is supplied to two capstans 34 and 35 in a manner such that the coated copper wire 14 is to be wound around the two capstans 34 and 35. Particularly, drawing is performed as the coated copper wire 14 sequentially passes through a plurality of dies 90 to 97 that are provided between the two capstans 34 and 35. As shown in FIG. 9, eight dies 90 to 97 are provided. In general, the final drawing step is a step of turning the coated copper wire 14 into the bonding wire 15 of the final product, by drawing the coated copper wire 14 until the diameter thereof has reached the diameter of the final product. For this reason, more dies such as the dies 90 to 97 are used as compared to the previous drawing steps. Thus, diameter shrinkage can be performed at a large rate of reduction in area.

In this way, by using the method for manufacturing the bonding wire of the present mode of the invention, there can be manufactured the bonding wire 15 having the fibrous structure 11 formed in the center of the core member 10.

Working Example

Next, bonding wires of working examples of the invention and manufacturing methods thereof are described by comparison with comparative examples.

Table 1 shows bonding wires of working examples 1 to 11 of the invention and manufacturing methods thereof; and bonding wires of comparative examples 1 to 11 and manufacturing methods thereof.

working examples 1 to 11, the diameter shrinkage rate of each die was set to be either 12% or 10% in the range where the diameter shrinkage rate of the entire core member reached from 96% to 99.9%. That is, the diameter shrinkage rate of each die in the working examples 1 to 11 and the comparative examples 1 to 11, was set to be different from each other until the diameter shrinkage rate of the entire core member had reached 96%.

Further, in the working examples 1 to 11 and the comparative examples 1 to 11, used as a copper raw material of the core member was a either a commercial 4N oxygen-free copper or a 6N electrolytic copper prepared by further performing electrolytic refining on a commercial 4N electrolytic copper. As phosphorus, there was used a commercial 15% phosphor copper bullion. A heat treatment 1 (softening heat treatment) was performed when the wire diameter was about 1 mm, for 60 minutes under a nitrogen atmosphere and at a temperature not lower than the recrystallization starting temperature and not higher than the recrystallization ending temperature. Here, while there were examples in which the softening heat treatment was performed, there were also examples in which it was not performed. Thus, in Table 1, examples in which the softening heat treatment was performed were marked as "Performed", whereas examples in which it was not performed were marked as "Not per-

TABLE 1

|  |  | Core member Purity of copper | Diameter shrinkage rate % Rate of reduction in area ~96% | Heat treatment 1 Wire diameter 1 mm | Diameter shrinkage rate % Rate of reduction in area ~99.9% | Diameter of plated wire μm | Thickness of Pd plating μm | Thickness of Au plating μm | Final wire diameter μm |
|---|---|---|---|---|---|---|---|---|---|
| Working example | 1 | 4N | 7 | No performed | 12 | 444 | 1.02 | 0 | 18 |
|  | 2 | 4N | 7 | No performed | 12 | 199 | 0.46 | 0 | 18 |
|  | 3 | 4N | 10 | Performed | 10 | 199 | 0.46 | 0 | 18 |
|  | 4 | 6N | 7 | Performed | 12 | 199 | 0.46 | 0 | 15 |
|  | 5 | 6N | 10 | No performed | 12 | 199 | 0.46 | 0 | 18 |
|  | 6 | 6N | 7 | Performed | 12 | 444 | 1.02 | 0 | 15 |
|  | 7 | 6N | 7 | No performed | 12 | 450 | 1.03 | 0.026 | 18 |
|  | 8 | 6N | 7 | Performed | 12 | 450 | 1.03 | 0.026 | 18 |
|  | 9 | 6N | 7 | Performed | 12 | 450 | 1.03 | 0.026 | 20 |
|  | 10 | 6N | 7 | Performed | 12 | 450 | 1.03 | 0.026 | 23 |
|  | 11 | 6N | 7 | Performed | 12 | 450 | 1.03 | 0.026 | 25 |
| Comparative example | 1 | 4N | 18 | No performed | 12 | 444 | 1.02 | 0 | 18 |
|  | 2 | 4N | 18 | No performed | 12 | 199 | 0.46 | 0 | 18 |
|  | 3 | 4N | 12 | Performed | 10 | 199 | 0.46 | 0 | 18 |
|  | 4 | 6N | 18 | Performed | 12 | 199 | 0.46 | 0 | 15 |
|  | 5 | 6N | 12 | No performed | 12 | 199 | 0.46 | 0 | 18 |
|  | 6 | 6N | 18 | Performed | 12 | 444 | 1.02 | 0 | 15 |
|  | 7 | 6N | 18 | No performed | 12 | 450 | 1.03 | 0.026 | 18 |
|  | 8 | 6N | 18 | Performed | 12 | 450 | 1.03 | 0.026 | 18 |
|  | 9 | 6N | 18 | Performed | 12 | 450 | 1.03 | 0.026 | 20 |
|  | 10 | 6N | 18 | Performed | 12 | 450 | 1.03 | 0.026 | 23 |
|  | 11 | 6N | 18 | Performed | 12 | 450 | 1.03 | 0.026 | 25 |

As shown in Table 1, as for the bonding wires of the working examples 1 to 11 and the manufacturing methods thereof, the diameter shrinkage rate of each die was set to be either 7% or 10% until the diameter shrinkage rate (rate of reduction in area) of the entire core member had reached 96%. Meanwhile, the diameter shrinkage rate of each die was set to be either 12% or 10% in a range where the diameter shrinkage rate of the entire core member reached from 96% to 99.9%.

Meanwhile, as for the comparative examples 1 to 11, the diameter shrinkage rate of each die was set to be either 18% or 12% until the diameter shrinkage rate of the entire core member had reached 96%. Further, as is the case in the formed." After performing plating, drawing was performed at a given processing diameter shrinkage rate until the wire diameter had reached the final wire diameter, and annealing was performed under a nitrogen gas atmosphere such that the elongation ratio became 9 to 10.5% if manufacturing a wire mainly used to perform wire bonding; 4 to 4.5% if manufacturing a wire mainly used to perform bump wire bonding.

Figure 10A:
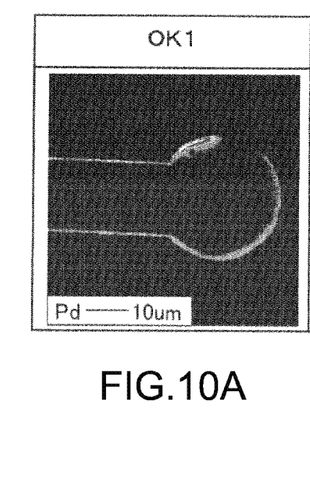
FIG. 10A is a diagram showing an example of a mapping result of a palladium concentration on a ball cross-section when using a non-defective bonding wire.
Figure 10B:
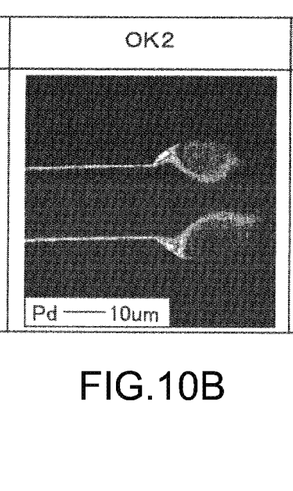
FIG. 10B is a diagram showing an other example of a mapping result of a palladium concentration on a ball cross-section when using a non-defective bonding wire.
Figure 10C:
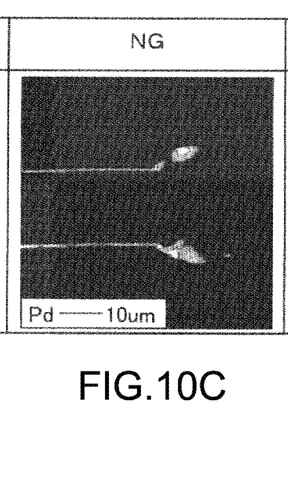
FIG. 10C is a diagram showing an example of a mapping result of a palladium concentration on a ball cross-section when using a defective bonding wire
Figure 10D:
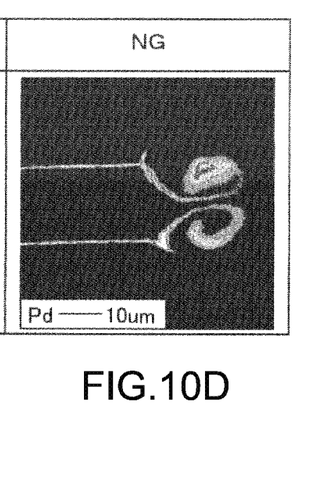
FIG. 10D is a diagram showing an other example of a mapping result of a palladium concentration on a ball cross-section when using a defective bonding wire.

FIG. 10A to FIG. 10D are diagrams describing a method for evaluating a mapping result of a palladium concentration on a ball cross-section at the time of performing wire bonding using the bonding wires of the working examples 1 to 11 and the comparative examples 1 to 11 of the present invention. FIG. 10A is a diagram showing an example of a mapping result of a palladium concentration on a ball cross-section when using a non-defective bonding wire, and FIG. 10B is a diagram showing an other example of a mapping result of a palladium concentration on a ball cross-section when using a non-defective bonding wire. FIG. 10C is a diagram showing an example of a mapping result of a palladium concentration on a ball cross-section when using a defective bonding wire, and FIG. 10D is a diagram showing an other example of a mapping result of a palladium concentration on a ball cross-section when using a defective bonding wire.

As for the working examples related to FIG. 10A to FIG. 10D, a ball-surface distribution of palladium was particularly evaluated by forming a ball having a diameter 1.6 times larger than the wire diameter in either a nitrogen gas atmosphere or a nitrogen atmosphere containing hydrogen at a ratio of 4 to 5 Vol %; forming a ball cross-section using an ion polisher; and then mapping the palladium concentration through EPMA analysis. Here, in FIG. 10A to FIG. 10D, areas shown by either white or gray are areas where palladium is distributed.

In FIG. 10A, since the palladium film is distributed on the surface of the ball, copper as the core member 10 is not exposed but prevented from coming into contact with an aluminum terminal. Therefore, this is considered OK. And, such condition is marked as OK1 hereunder.

In FIG. 10B, although palladium is slightly diffused inside the ball, it also remains on the ball surface. Therefore, this falls into the category of OK. And, such condition is marked as OK2 hereunder.

In FIG. 10C, although palladium exists in a root region of the ball, it barely exists in a region beginning from a center toward a head portion thereof. Therefore, it is considered that copper is exposed, thus falling into the category of NG.

In FIG. 10D, palladium is diffused inside the ball. And, almost no palladium remains on the ball surface. Therefore, it is considered that copper is exposed, thus falling into the category of NG.

Table 2 shows working results of the bonding wires of the working examples 1 to 11 of the present invention and the manufacturing methods thereof; and working results of the bonding wires of the comparative examples 1 to 11 and the manufacturing methods thereof.

TABLE 2

| Sample number | 100% N2 Pd distribution | 5% H2-95% N2 Pd distribution | FAB appearance |
|---|---|---|---|
| Working example 1 | OK1 | OK2 | OK |
| Working example 2 | OK1 | OK1 | OK |
| Working example 3 | OK1 | OK1 | OK |
| Working example 4 | OK1 | OK1 | OK |
| Working example 5 | OK1 | OK1 | OK |
| Working example 6 | OK1 | OK2 | OK |
| Working example 7 | OK1 | OK2 | OK |
| Working example 8 | OK1 | OK2 | OK |
| Working example 9 | OK1 | OK2 | OK |
| Working example 10 | OK1 | OK2 | OK |
| Working example 11 | OK1 | OK2 | OK |
| Comparative example 1 | OK2 | NG | NG |
| Comparative example 2 | OK1 | NG | NG |
| Comparative example 3 | OK1 | NG | NG |
| Comparative example 4 | OK1 | NG | NG |
| Comparative example 5 | OK1 | NG | NG |
| Comparative example 6 | OK2 | NG | NG |
| Comparative example 7 | OK2 | NG | NG |
| Comparative example 8 | OK2 | NG | NG |
| Comparative example 9 | OK2 | NG | NG |
| Comparative example 10 | OK2 | NG | NG |
| Comparative example 11 | OK2 | NG | NG |

As shown in Table 2, under a 100% nitrogen gas atmosphere, the palladium distributions of both the working examples 1 to 11 and the comparative examples 1 to 11 fall into the category of either OK1 or OK2. However, under a nitrogen gas atmosphere mixed with a hydrogen gas, while the palladium distributions of the working examples 1 to 11 fall into the category of either OK1 or OK2, the palladium distributions of the comparative examples 1 to 11 fall into the category of NG.

Further, as for ball appearance, OK (non-defective) was given when defects such as copper exposure, dents and sharpening were not observed on the surfaces of 50 balls, whereas NG (defective) was given when such defects were observed in even one ball. Here, while all the working examples 1 to 11 were given OK, all the comparative examples 1 to 11 were given NG.

As for the working examples 1 to 11, palladium was found to be concentrated substantially over an entire region in the vicinity of the ball surface when using an EPMA to perform observational mapping on palladium distribution on a cross-section of a melted ball formed on a wire front end, the melted ball being formed by heating the wire front end with a plasma arc of a current value of not lower than 50 mA under a mixed gas atmosphere of nitrogen containing hydrogen at the ratio of 4 to 5 Vol %.

In this way, according to the bonding wires of the present mode and the working examples and then the manufacturing methods thereof, the palladium-coated copper bonding wire is capable of preventing copper from being exposed at the time of performing wire bonding.

Although preferable mode and working examples of the present invention have so far been described in detail, the present invention is not limited to the aforementioned mode and working examples. In fact, various modifications and substitutions can be made to the aforementioned mode and working examples without departing from the scope of the present invention.

The present invention can be used to perform wire bonding for semiconductor packaging.

What is claimed:

1. A bonding wire comprising:
    a core member mainly composed of copper; and
    a palladium coating layer, wherein
    said core member includes a fibrous structure with copper crystals extending in an axial direction, said fibrous structure being formed in a center of said core member, and
    said core member includes a grain-shaped recrystallized region formed through a recrystallization of crystals, said grain-shaped recrystallized region being formed surrounding said fibrous structure.

2. The bonding wire according to claim 1, further including a gold coating layer formed on said palladium coating layer.

3. The bonding wire according to claim 1, wherein said fibrous structure exists in said core member in an amount of 0.5 to 90% by mass.

4. The bonding wire according to claim 2, wherein said fibrous structure exists in said core member in an amount of 0.5 to 90% by mass.

5. The bonding wire according to claim 1, wherein said fibrous structure exists within a region of 0.8R from a center, provided that a radius of said core member is R.

6. The bonding wire according to claim 2, wherein said fibrous structure exists within a region of 0.8R from a center, provided that a radius of said core member is R.

7. The bonding wire according to claim 3, wherein said fibrous structure exists within a region of 0.8R from a center, provided that a radius of said core member is R.

8. The bonding wire according to claim 4, wherein said fibrous structure exists within a region of 0.8R from a center, provided that a radius of said core member is R.

* * * * *